United States Patent
Nakatsuka

(10) Patent No.: US 10,978,471 B2
(45) Date of Patent: Apr. 13, 2021

(54) SEMICONDUCTOR MEMORY DEVICE

(71) Applicant: Toshiba Memory Corporation, Tokyo (JP)

(72) Inventor: Keisuke Nakatsuka, Kobe Hyogo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 6 days.

(21) Appl. No.: 16/351,207

(22) Filed: Mar. 12, 2019

(65) Prior Publication Data

US 2020/0091183 A1 Mar. 19, 2020

(30) Foreign Application Priority Data

Sep. 13, 2018 (JP) .............................. JP2018-171220

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ........... H01L 27/1128; H01L 21/76816; H01L 21/76877; H01L 23/5226; H01L 23/5283; G11C 7/18
USPC ....................................................... 257/401
See application file for complete search history.

(56) References Cited

U.S. PATENT DOCUMENTS

| | | | |
|---|---|---|---|
| 6,946,988 B2 | 9/2005 | Edwards | |
| 8,680,604 B2 | 3/2014 | Higashi | |
| 10,748,920 B2 * | 8/2020 | Nakatsuka | ........ H01L 29/40117 |
| 2016/0268304 A1 | 9/2016 | Ikeda | |
| 2017/0069653 A1 * | 3/2017 | Naito | .................. H01L 27/1157 |
| 2017/0186766 A1 * | 6/2017 | Kitao | .................. H01L 27/1157 |

FOREIGN PATENT DOCUMENTS

JP 5330017 B2 10/2013

* cited by examiner

*Primary Examiner* — Andy Huynh
(74) *Attorney, Agent, or Firm* — Foley & Lardner LLP

(57) ABSTRACT

A semiconductor memory device includes first structure bodies and second structure bodies arranged alternately along a first direction. The first structure body includes electrode films arranged along a second direction. The second structure body includes columnar members, first insulating members, and second insulating members. The columnar member includes a semiconductor member extending in the second direction and a charge storage member provided between the semiconductor member and the electrode film. The second insulating members are arranged along a third direction. Lengths in the first direction of the second insulating members are longer than lengths in the first direction of the first insulating members. Positions of the second insulating members in the third direction are different from each other between the second structure bodies adjacent to each other in the first direction. The columnar members and the first insulating members are arranged alternately between the second insulating members.

14 Claims, 13 Drawing Sheets

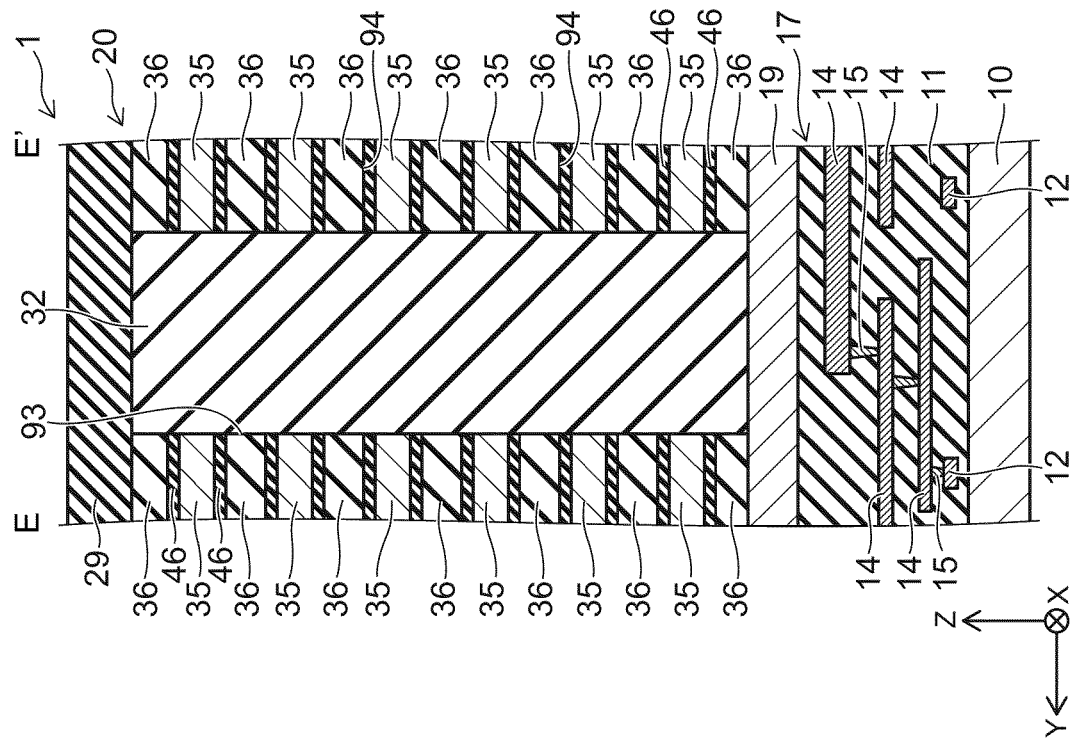
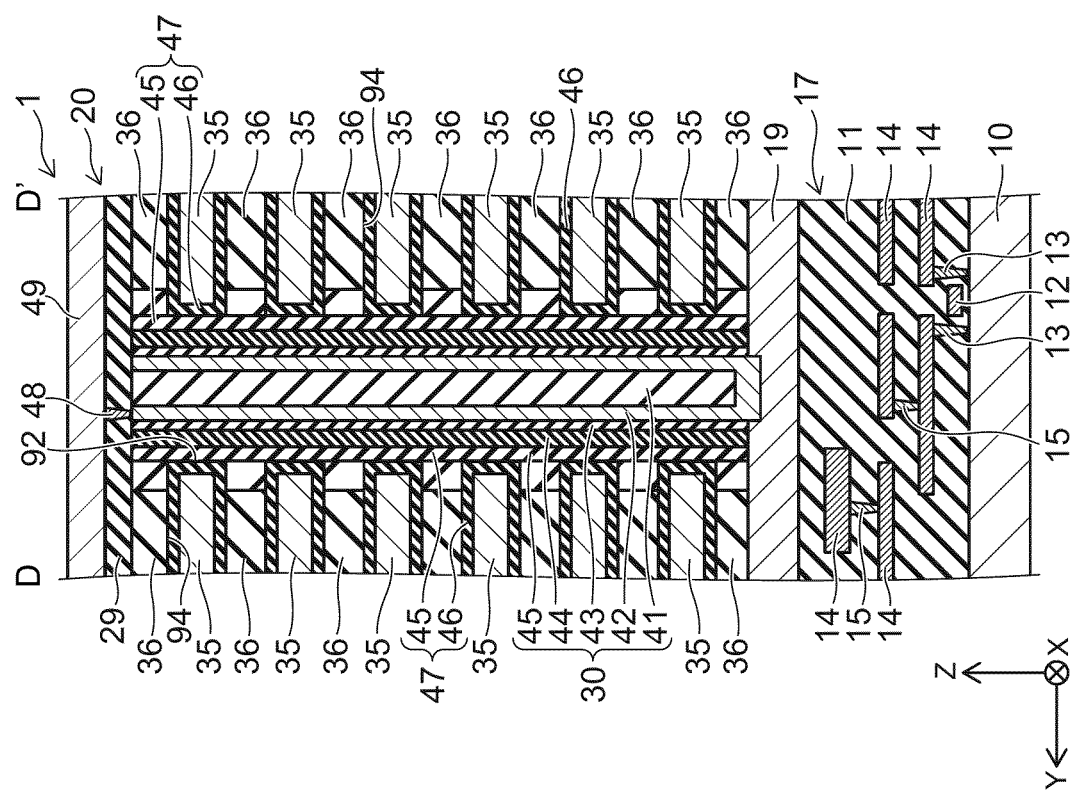

SEMICONDUCTOR MEMORY DEVICE

CROSS-REFERENCE TO RELATED APPLICATIONS

This application is based upon and claims the benefit of priority from Japanese Patent Application No. 2018-171220, filed on Sep. 13, 2018; the entire contents of which are incorporated herein by reference.

FIELD

Embodiments relate to a semiconductor memory device.

BACKGROUND

A three-dimensional semiconductor memory device has been developed in recent years. In the three-dimensional semiconductor memory device, a stacked body in which multiple electrode films are stacked is provided on a substrate; multiple semiconductor members that pierce the stacked body are provided; and memory cell transistors are formed at the crossing portions between the electrode films and the semiconductor members. In the three-dimensional semiconductor memory device as well, even higher integration of the memory cell transistors is desirable.

BRIEF DESCRIPTION OF THE DRAWINGS

FIG. 5A is a cross-sectional view along line D-D' shown in FIG. 4; and FIG. 5B is a cross-sectional view along line E-E' shown in FIG. 4;

DETAILED DESCRIPTION

A semiconductor memory device according to an embodiment, includes a plurality of first structure bodies and a plurality of second structure bodies. The plurality of first structure bodies and the plurality of second structure bodies are arranged alternately along a first direction. The first structure body includes a plurality of electrode films arranged to be separated from each other along a second direction crossing the first direction. The second structure body includes a plurality of columnar members, a plurality of first insulating members, and a plurality of second insulating members. The columnar member includes a semiconductor member and a charge storage member. The semiconductor member extends in the second direction. The charge storage member is provided between the semiconductor member and the electrode film. The plurality of second insulating members are arranged along a third direction crossing the first direction and the second direction. Lengths in the first direction of the plurality of second insulating members are longer than lengths in the first direction of the plurality of first insulating members. Positions of the second insulating members in the third direction are different from each other between the second structure bodies adjacent to each other in the first direction. The columnar members and the first insulating members are arranged alternately between the second insulating members.

First Embodiment

A first embodiment will now be described.

Figure 1:
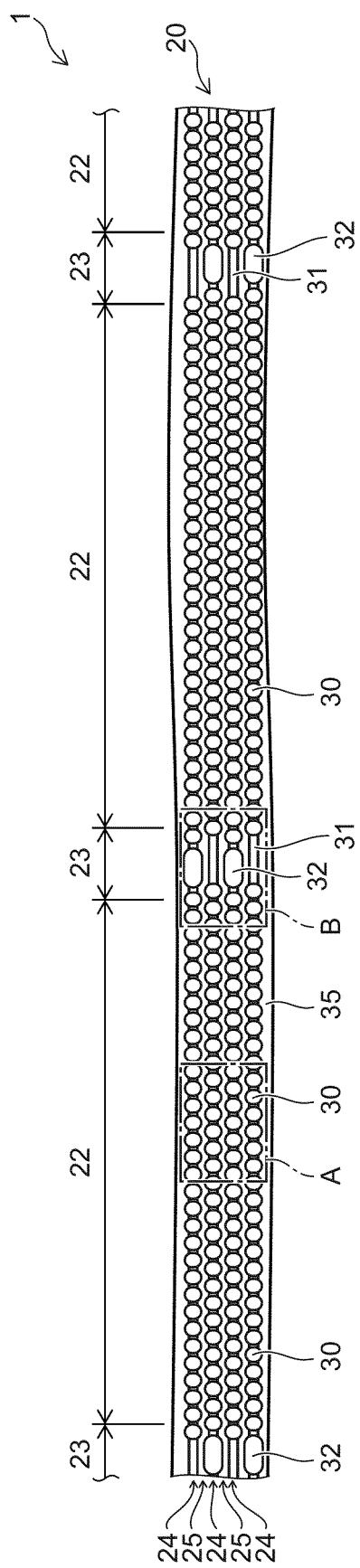
FIG. 1 is a plan view showing a semiconductor memory device according to a first embodiment.

FIG. 1 is a plan view showing a semiconductor memory device according to the embodiment.

Figure 2:
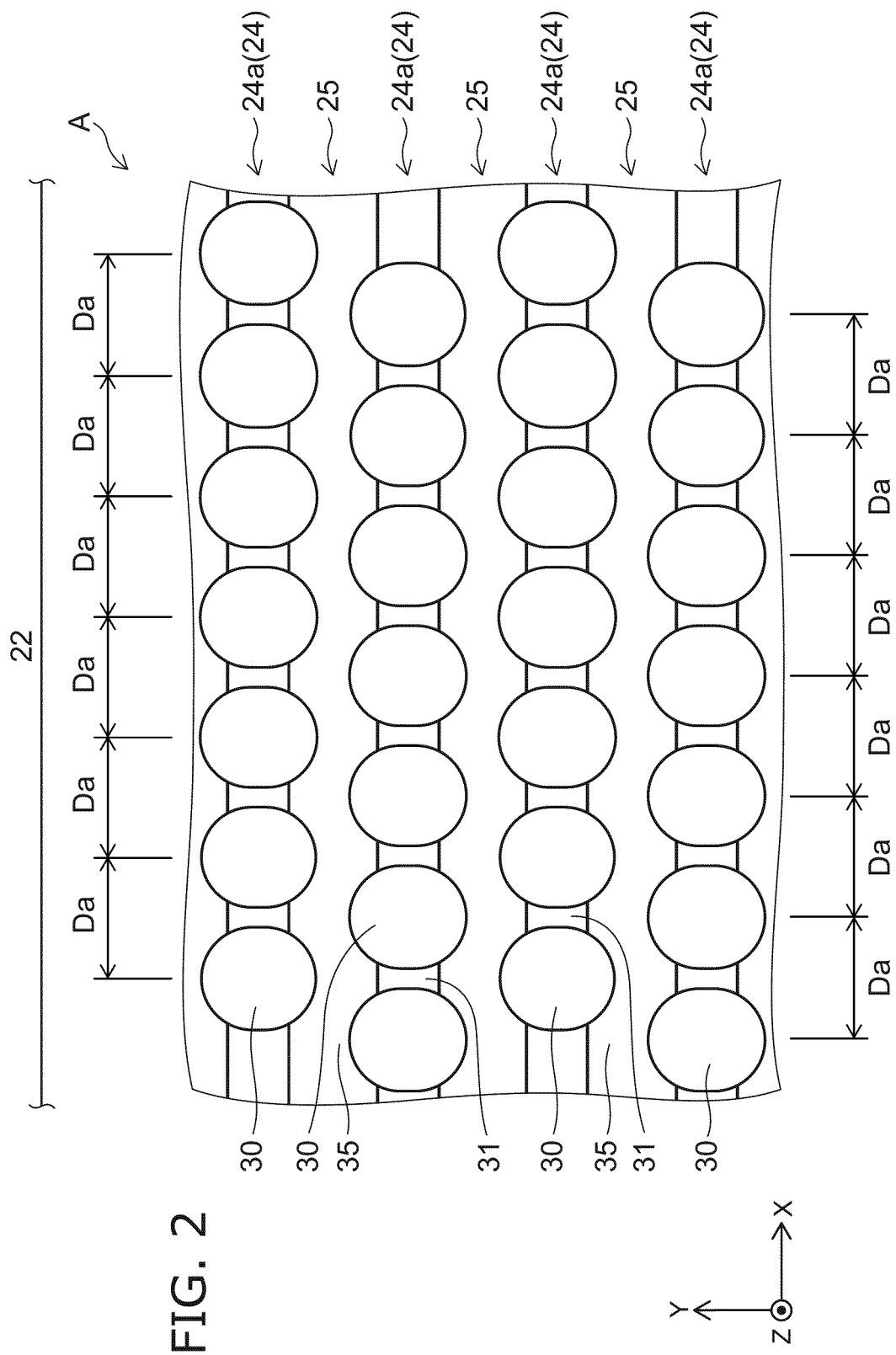
FIG. 2 is a plan view showing region A of FIG. 1.

FIG. 2 is a plan view showing region A of FIG. 1.

Figure 3:
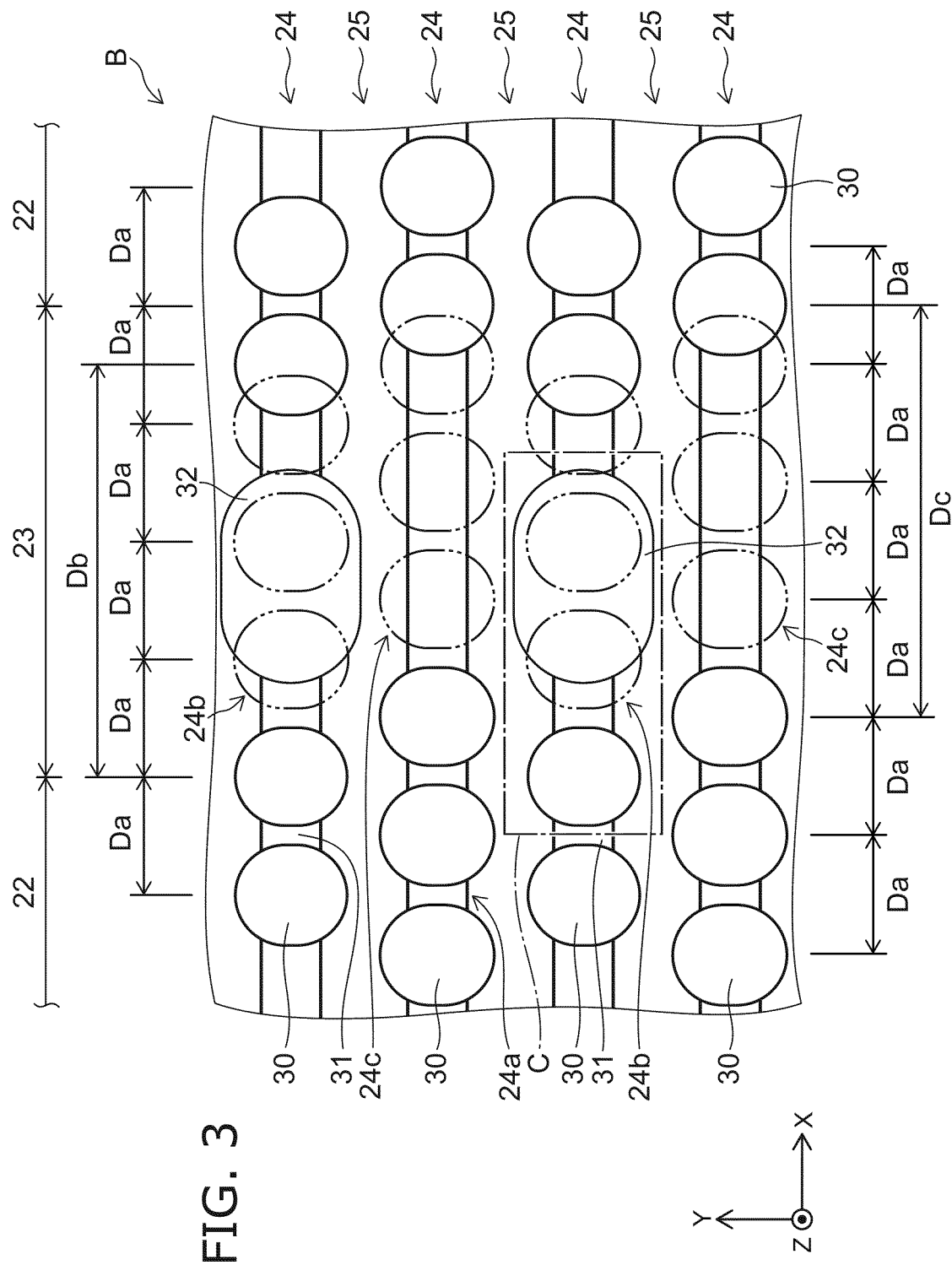
FIG. 3 is a plan view showing region B of FIG. 1.

FIG. 3 is a plan view showing region B of FIG. 1.

Figure 4:
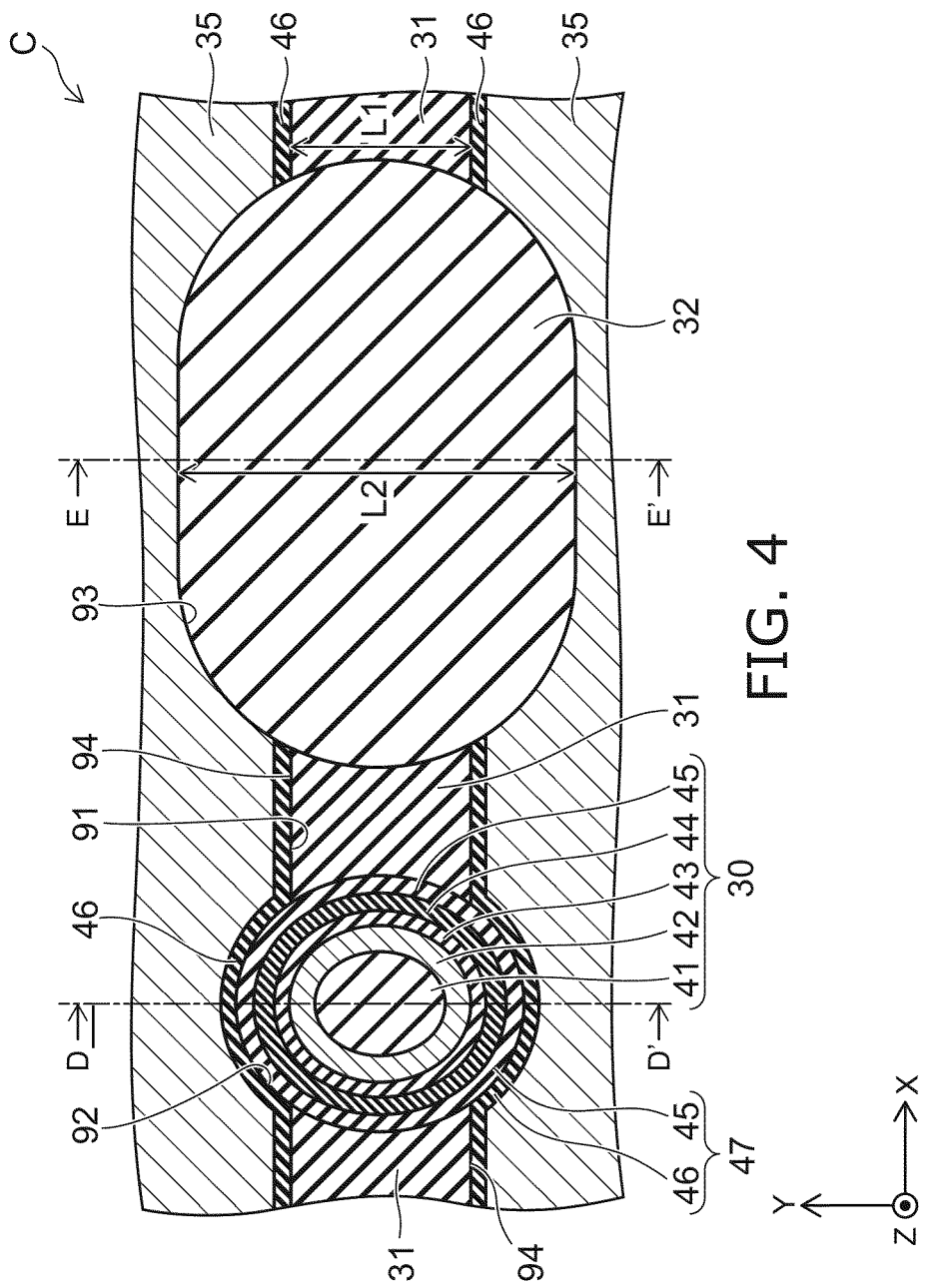
FIG. 4 is a cross-sectional view corresponding to region C of FIG. 3.

FIG. 4 is a cross-sectional view corresponding to region C of FIG. 3.

FIG. 5A is a cross-sectional view along line D-D' shown in FIG. 4; and FIG. 5B is a cross-sectional view along line E-E' shown in FIG. 4.

The drawings are schematic; and the numbers and the dimensional ratios of the components do not always match between the drawings.

As shown in FIGS. 5A and 5B, for example, a silicon substrate 10 that is made of single-crystal silicon (Si) is provided in the semiconductor memory device 1 according to the embodiment. An impurity diffusion layer (not illustrated), STI (Shallow Trench Isolation (an element-separating insulating film)) (not illustrated), etc., are formed at the upper layer portion of the silicon substrate 10. An inter-layer insulating film 11 is provided on the silicon substrate 10. A gate electrode 12, a contact 13, an interconnect 14, a via 15, etc., are provided inside the inter-layer insulating film 11. Thereby, a control circuit 17 is formed inside the upper layer portion of the silicon substrate 10 and the inter-layer insulating film 11. A source electrode film 19 is provided as a conductive body on the inter-layer insulating film 11. A stacked body 20 is provided on the source electrode film 19. An inter-layer insulating film 29 is provided on the stacked body 20.

In the specification hereinbelow, an XYZ orthogonal coordinate system is employed for convenience of description. The arrangement direction of the silicon substrate 10, the inter-layer insulating film 11, the source electrode film 19, and the stacked body 20 is taken as a "Z-direction." Although a direction that is in the Z-direction from the silicon substrate 10 toward the stacked body 20 also is called "up" and the reverse direction also is called "down," these expressions are for convenience and are independent of the direction of gravity. Also, two mutually-orthogonal directions orthogonal to the Z-direction are taken as an "X-direction" and a "Y-direction."

As shown in FIG. 1, memory cell regions 22 and replace regions 23 are set in the stacked body 20. The memory cell regions 22 and the replace regions 23 are arranged alternately along the X-direction. Memory cell structure bodies 24 and word line structure bodies 25 are arranged alternately along the Y-direction over the entirety including the memory cell regions 22 and the replace regions 23 arranged along the X-direction. The memory cell structure body 24 and the word line structure body 25 each are structure bodies extending in the X-direction over the entire stacked body 20.

The internal structures of the memory cell structure body 24 and the word line structure body 25 are described below.

As shown in FIG. 4, a columnar member 30, an insulating member 31, and an insulating member 32 are provided in each of the memory cell structure bodies 24. The configuration of the columnar member 30 is a columnar configuration having the central axis extending in the Z-direction and is, for example, a substantially circular column or an elliptical column. In the case where the configuration of the columnar member 30 is an elliptical column, the major-diameter direction of the elliptical column is the Y-direction; and the minor-diameter direction is the X-direction. The internal structure of the columnar member 30 is described below.

The configuration of the insulating member 31 is, for example, a substantially rectangular parallelepiped extending in the Z-direction. For example, the insulating member 31 is formed of an insulating material such as silicon oxide (SiO), etc. For example, the configuration of the insulating member 32 is a substantially elliptical column or an oval column in which the central axis extends in the Z-direction, the major-diameter direction is the X-direction, and the minor-diameter direction is the Y-direction. The insulating member 32 is formed of, for example, an insulating material such as silicon oxide, etc.

As shown in FIG. 1 and FIG. 2, the columnar members 30 and the insulating members 31 are arranged alternately and periodically along the X-direction in the memory cell region 22. The arrangement period of the columnar members 30 along the X-direction in the memory cell region 22 is taken as Da. The positions in the X-direction of the columnar members 30 are shifted from each other between the mutually-adjacent memory cell structure bodies 24; and the positions in the X-direction of the columnar members 30 are the same between every other memory cell structure body 24. Therefore, the columnar members 30 are arranged in a staggered configuration when viewed from the Z-direction.

Specifically, for a first memory cell structure body 24 and a second memory cell structure body 24 adjacent to each other in the Y-direction in which a first columnar member 30 and a second columnar member 30 are provided in the first memory cell structure body 24 and are adjacent to each other in the X-direction, the insulating member 31 is provided between the first columnar member 30 and the second columnar member 30. Also, a third columnar member 30 that is provided in the second memory cell structure body 24 is positioned between the first columnar member 30 and the second columnar member 30 in the X-direction and is provided at a different position in the Y-direction.

As shown in FIG. 1 and FIG. 3, the insulating member 32 is disposed in the replace region 23. However, there are also replace regions 23 in which the insulating member 32 is not disposed. In each of the memory cell structure bodies 24, the replace region 23 in which the insulating member 32 is disposed and the replace region 23 in which the insulating member 32 is not disposed are arranged alternately in the X-direction. Therefore, in each of the memory cell structure bodies 24, the multiple insulating members 32 are arranged periodically along the X-direction; and the arrangement period of the multiple insulating members 32 is 2 times the arrangement period of the replace regions 23. In other words, in each of the memory cell structure bodies 24, one insulating member 32 is provided in every other replace region 23. The insulating member 32 contacts the insulating members 31 disposed on the two X-direction sides. In each of the memory cell structure bodies 24, the columnar members 30 and the insulating members 31 are arranged alternately along the X-direction between the insulating members 32 adjacent to each other in the X-direction.

The replace region 23 in which the insulating member 32 is disposed and the replace region 23 in which the insulating member 32 is not disposed are adjacent to each other in the Y-direction between the mutually-adjacent memory cell structure bodies 24. Therefore, in one replace region 23, the insulating member 32 is provided in every other memory cell structure body 24 in the Y-direction.

As shown in FIG. 4, the minor diameter, i.e., a length L2 in the Y-direction, of the insulating member 32 is greater than the width, i.e., a length L1 in the Y-direction, of the insulating member 31. In other words, L2>L1.

As shown in FIG. 3, in each of the memory cell structure bodies 24, the portion that is positioned at the memory cell region 22 is taken as a "portion 24a." The portion that is positioned at the replace region 23 in which the insulating member 32 is disposed is taken as a "portion 24b;" and the portion that is positioned at the replace region 23 in which the insulating member 32 is not disposed is taken as a "portion 24c."

As shown in FIG. 1 and FIG. 3, in each of the memory cell structure bodies 24, the portion 24b and the portion 24c are arranged alternately along the X-direction; and the portion 24a is disposed between the portion 24b and the portion 24c. Also, when focusing on one replace region 23, the portion 24b and the portion 24c are arranged alternately over the multiple memory cell structure bodies 24 arranged along the Y-direction. In other words, in both the X-direction and the Y-direction, the portion 24b is disposed between the portions 24c; and the portion 24c is disposed between the portions 24b.

As described above, the arrangement period of the columnar members 30 in the portion 24a is Da. The arrangement period of the columnar members 30 refers to the arrangement period in the X-direction of the centers of the columnar members 30 when viewed from the Z-direction. For example, thirty-two columnar members 30 are arranged in each portion 24a. A distance Db between the centers of the columnar members 30 sandwiching the insulating member 32 in the portion 24b is longer than the arrangement period Da. A distance Dc between the centers of the columnar members 30 in the portion 24c also is longer than the arrangement period Da. Therefore, the arrangement density of the columnar members 30 in the replace region 23 is lower than the arrangement density of the columnar members 30 in the memory cell region 22.

In the embodiment, the arrangement of the columnar members 30 in one memory cell region 22 is shifted by half a period with respect to the arrangements of the columnar members 30 in other memory cell regions 22 adjacent to each other in the X-direction with the one memory cell region 22 and the replace regions 23 interposed. As a result, the distance Db between the centers of the columnar members 30 in the portion 24b is 3.5 times the arrangement period Da; and the distance Dc between the centers of the columnar members 30 in the portion 24c also is 3.5 times the arrangement period Da. In other words, Db=3.5 Da; and Dc=3.5 Da.

Actually, there is a possibility that the distances Db and Dc may fluctuate due to the error of the processes, etc.; but the distances Db and Dc each are greater than 3 times but less than 4 times the arrangement period Da. In other words, 3 Da<Db<4 Da; and 3 Da<Dc<4 Da.

In FIG. 3, the ellipses drawn by the double dot-dash lines illustrate the regions where the columnar members 30 would be positioned if the columnar members 30 were arranged at the period Da; actually, the columnar members 30 are not disposed at these positions. The columnar members 30 that are actually disposed are illustrated by the solid-line ellipses. This is similar for similar drawings described below as well.

On the other hand, in the word line structure body 25 as shown in FIG. 4 and FIGS. 5A and 5B, electrode films 35 and insulating films 36 are stacked alternately along the Z-direction. For example, the electrode film 35 is made from a conductive material such as tungsten (W), etc.; for example, the insulating film 36 is made of an insulating material such as silicon oxide, etc.

The configuration of each of the columnar members 30 will now be described.

In each of the columnar members 30 as shown in FIG. 4 and FIG. 5A, a core member 41, a silicon pillar 42, a tunneling insulating film 43, a charge storage film 44, and a silicon oxide layer 45 are provided in this order from the central axis toward the outside. The configuration of the core member 41 is substantially a column in which the central axis extends in the Z-direction. The configurations of the silicon pillar 42, the tunneling insulating film 43, the charge storage film 44, and the silicon oxide layer 45 are substantially tubes in which the central axes extend in the Z-direction. The charge storage film 44 is disposed between the electrode film 35 and at least the tunneling insulating film 43. The silicon oxide layer 45 is disposed between the charge storage film 44 and the electrode film 35.

The core member 41 is formed of an insulating material and is formed of, for example, silicon oxide. As the semiconductor member, the silicon pillar 42 is formed of silicon that is a semiconductor material. The lower end of the silicon pillar 42 is connected to the source electrode film 19; and the upper end of the silicon pillar 42 is connected to a bit line 49 via a plug 48. The bit line 49 is provided in the memory cell region 22 and extends in the Y-direction. The plug 48 and the bit line 49 are provided inside the inter-layer insulating film 29.

Although the tunneling insulating film 43 normally is insulative, the tunneling insulating film 43 is a film in which a tunneling current flows when a prescribed voltage within the range of the drive voltage of the semiconductor memory device 1 is applied and is, for example, an ONO film in which a silicon oxide layer, a silicon nitride layer, and a silicon oxide layer are stacked in this order. The charge storage film 44 is a film that can store charge, is formed of an insulating material that has trap sites of, for example, electrons, and is made of, for example, silicon nitride (SiN). The silicon oxide layer 45 is made of silicon oxide.

A high dielectric constant layer 46 is provided at the periphery of the columnar member 30. The high dielectric constant layer 46 is formed of a high dielectric constant material having a dielectric constant that is higher than the dielectric constant of silicon oxide and is formed of, for example, aluminum oxide or hafnium oxide. The high dielectric constant layer 46 is provided on the upper surface of the electrode film 35, on the lower surface of the electrode film 35, on the side surface of the electrode film 35 facing the columnar member 30, and on the side surface of the electrode film 35 facing the insulating member 31, and is not provided on the side surface of the electrode film 35 facing the insulating member 32. In other words, the high dielectric constant layer 46 is disposed on the side surface of the silicon oxide layer 45 and on the side surface of the insulating member 31 but is not disposed on the side surface of the insulating member 32. The high dielectric constant layer 46 contacts the silicon oxide layer 45, the electrode film 35, and the insulating member 31. A blocking insulating film 47 is formed of the silicon oxide layer 45 and the high dielectric constant layer 46. The blocking insulating film 47 is a film in which a current substantially does not flow even when a voltage within the range of the drive voltage of the semiconductor memory device 1 is applied.

In the stacked body 20, one or multiple electrode films 35 from the top function as an upper select gate line; and an upper select gate transistor is configured at each crossing portion between the upper select gate line and the silicon pillars 42. Also, one or multiple electrode films 35 from the bottom function as a lower select gate line; and a lower select gate transistor is configured at each crossing portion between the lower select gate line and the silicon pillars 42. The electrode films 35 other than the upper select gate line and the lower select gate line function as word lines; and a memory cell transistor is configured at each crossing portion between the word lines and the silicon pillars 42. In the memory cell transistor, the silicon pillar 42 functions as a channel; the electrode film 35 functions as a gate; and the charge storage film 44 functions as a charge storage member. Thereby, a NAND string is formed by the multiple memory cell transistors being connected in series along each of the silicon pillars 42 and by the upper select gate transistor and the lower select gate transistor being connected at the two ends of the multiple memory cell transistors.

An example of a method for manufacturing the semiconductor memory device according to the embodiment will now be described briefly.

As shown in FIG. 4 and FIGS. 5A and 5B, impurity diffusion layers, STI, etc., are formed in the upper layer portion of the silicon substrate 10; and the inter-layer insulating film 11 is formed while forming the gate electrode 12, the contact 13, the interconnect 14, the via 15, etc. Thereby, the control circuit 17 is formed inside the upper layer portion of the silicon substrate 10 and the inter-layer insulating film 11. Then, the source electrode film 19 is formed on the inter-layer insulating film 11.

Then, the stacked body 20 is formed by stacking the insulating films 36 made of silicon oxide and sacrificial films (not illustrated) made of silicon nitride. Then, for example, a trench 91 that extends in the X-direction is formed in the stacked body 20 by performing anisotropic etching such as RIE (Reactive Ion Etching), etc. Then, the insulating member 31 is formed by filling silicon oxide into the trench 91. Then, in the memory cell region 22, memory holes 92 are formed by anisotropic etching to divide the insulating member 31. The memory holes 92 reach the source electrode film 19. The memory holes 92 are not formed in the X-direction central portion of the replace region 23.

Continuing, the columnar members 30 are formed by stacking the silicon oxide layer 45, the charge storage film 44, the tunneling insulating film 43, the silicon pillar 42, and the core member 41 on the inner surfaces of the memory holes 92.

Then, by performing anisotropic etching, through-holes 93 are formed to divide the insulating member 31 in the replace regions 23. The through-holes 93 reach the source electrode film 19. The through-holes 93 are not formed in the memory cell region 22. Then, the sacrificial films are removed via the through-holes 93 by performing isotropic etching. Thereby, a continuous space 94 is formed from the through-holes 93 inside the stacked body 20. The insulating film 36, the silicon oxide layer 45 of the columnar member 30, and the insulating member 31 are exposed at the inner surface of the space 94.

Continuing, the high dielectric constant layer 46 is formed on the inner surface of the space 94 by depositing a high dielectric constant material via the through-holes 93. Then, the electrode film 35 is formed inside the space 94 by depositing a conductive material such as tungsten, etc., via the through-holes 93. Then, the conductive material and the high dielectric constant material that are inside the through-holes 93 are removed. Then, the insulating members 32 are formed by filling silicon oxide into the through-holes 93.

Continuing, the inter-layer insulating film 29, the plugs 48, and the bit lines 49 are formed on the stacked body 20. Thus, the semiconductor memory device 1 according to the embodiment is manufactured.

According to the embodiment, processes in which deep etching of the stacked body including the electrode films 35 is performed can be avoided by setting the replace regions 23 and by replacing the sacrificial films with the electrode films 35 via the through-holes 93. As a result, the semiconductor memory device 1 can be manufactured easily. In the X-direction central portion of the replace region 23, the columnar members 30 cannot be formed; and the memory cell transistors are not formed.

However, in the embodiment, the arrangements of the columnar members 30 are shifted by half a period between the mutually-adjacent memory cell regions 22. Thereby, the distance Db between the centers of the columnar members 30 in the portion 24b of the memory cell structure body 24 is set to 3.5 Da; and the distance Dc between the centers of the columnar members 30 in the portion 24c is set to 3.5 Da. Therefore, the decrease of the memory cell transistors due to providing the replace regions 23 can be suppressed. As a result, the semiconductor memory device 1 that has high integration of the memory cell transistors can be realized.

Comparative Example

A comparative example will now be described.

Figure 6:
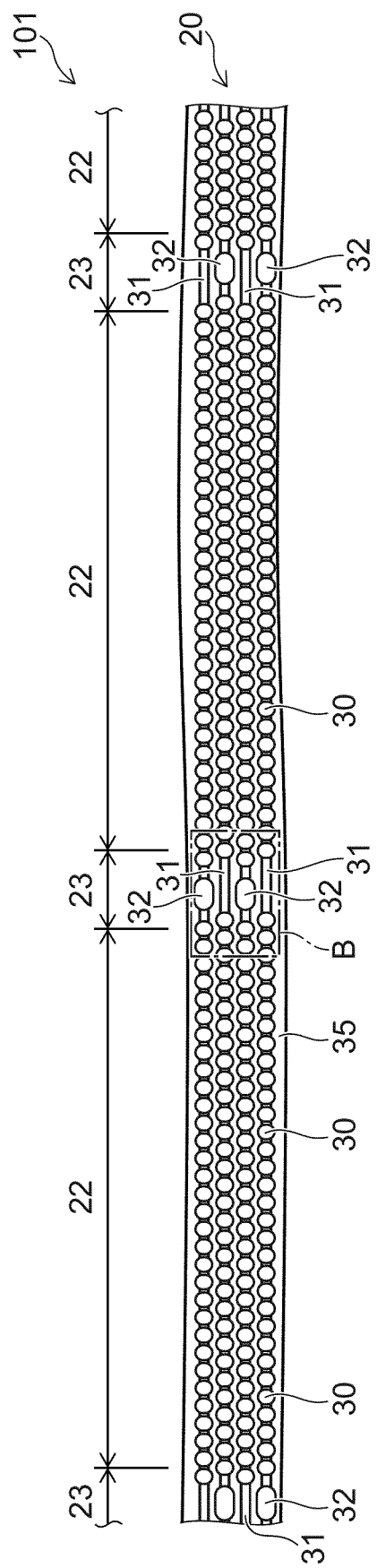
FIG. 6 is a plan view showing a semiconductor memory device according to a comparative example.

FIG. 6 is a plan view showing a semiconductor memory device according to the comparative example.

Figure 7:
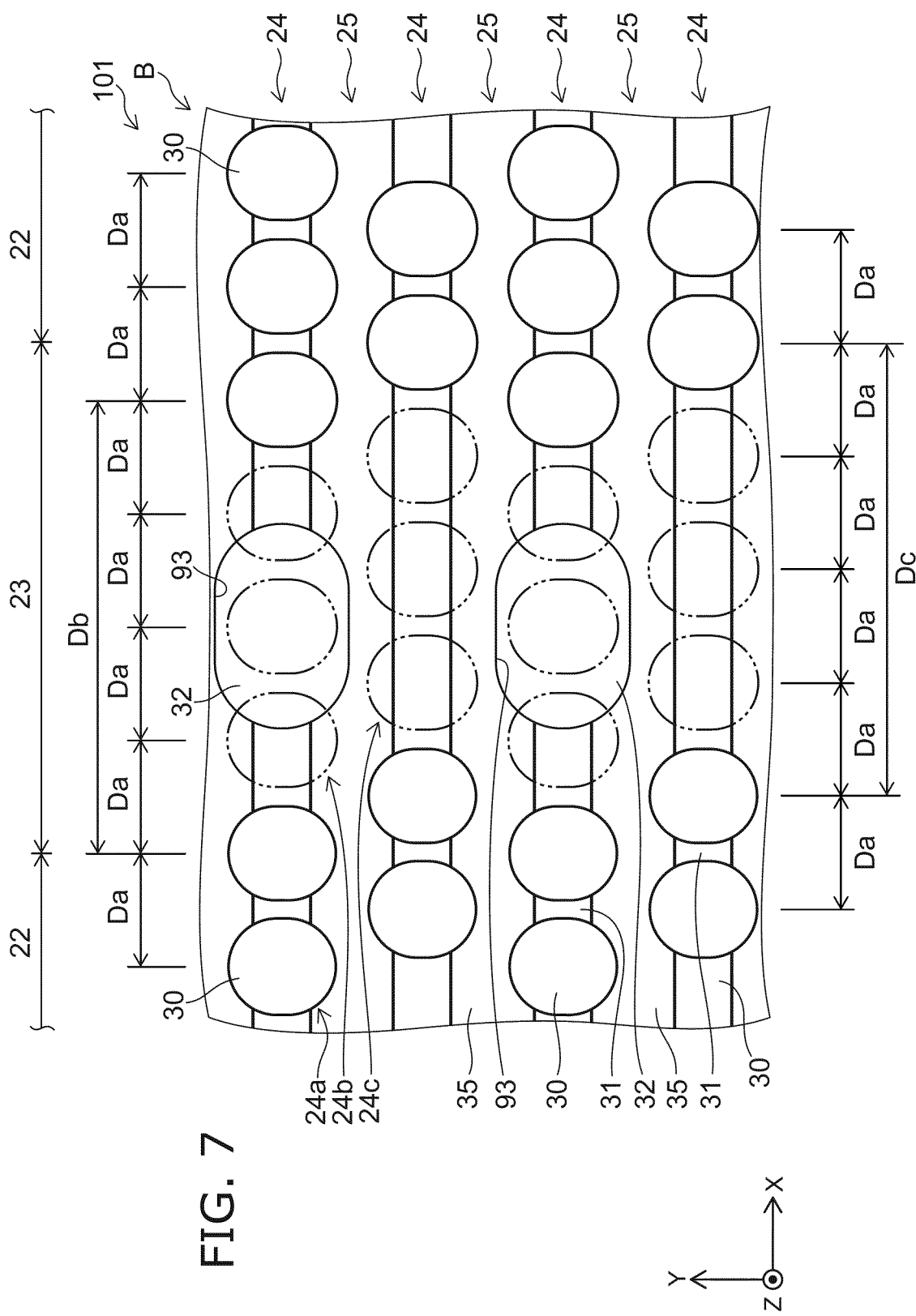
FIG. 7 is a plan view showing region B of FIG. 6.

FIG. 7 is a plan view showing region B of FIG. 6.

As shown in FIG. 6 and FIG. 7, in the semiconductor memory device 101 according to the comparative example, the space where the through-hole 93 (the insulating member 32) is formed is ensured by simply removing three columnar members 30 from each of the memory cell structure bodies 24 in the replace region 23. Therefore, the distance Db between the centers of the columnar members 30 in the portion 24b is 4 times the arrangement period Da; and the distance Dc between the centers of the columnar members 30 in the portion 24c also is 4 times the arrangement period Da. In other words, Db=4 Da; and Dc=4 Da. As a result, compared to the semiconductor memory device 1 according to the first embodiment, the integration density of the memory cell transistors is low in the semiconductor memory device 101 according to the comparative example.

Second Embodiment

A second embodiment will now be described.

Figure 8:
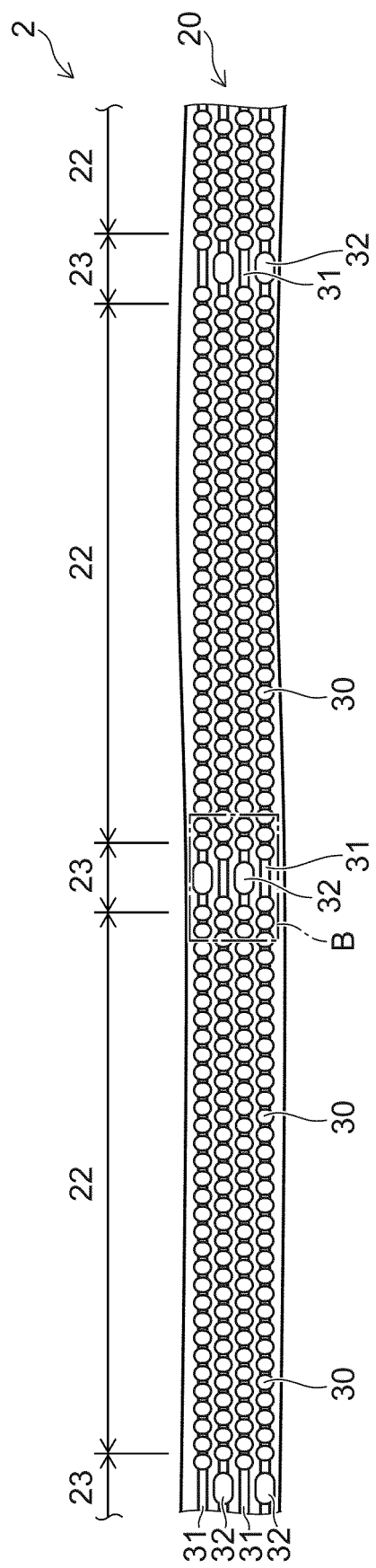
FIG. 8 is a plan view showing a semiconductor memory device according to a second embodiment.

FIG. 8 is a plan view showing a semiconductor memory device according to the embodiment.

Figure 9:
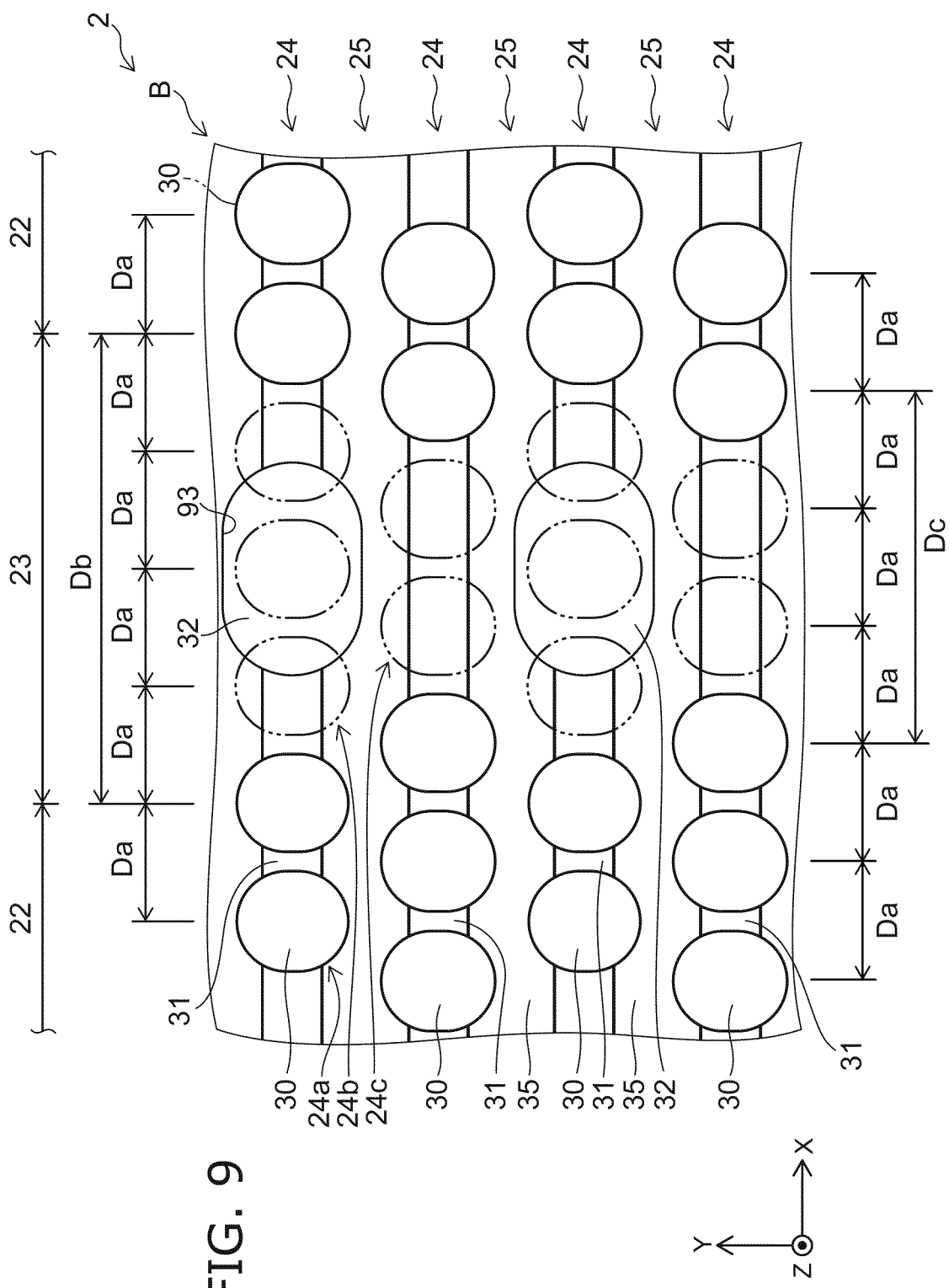
FIG. 9 is a plan view showing region B of FIG. 8.

FIG. 9 is a plan view showing region B of FIG. 8.

In the semiconductor memory device 2 according to the embodiment as shown in FIG. 8 and FIG. 9, the arrangements of the columnar members 30 have a mirror-image relationship with respect to the imaginary YZ plane between the memory cell regions 22 adjacent to each other in the X-direction. Thereby, in the replace region 23, three columnar members 30 are removed in the portion 24b in which the insulating member 32 is disposed; and two columnar members 30 are removed in the portion 24c in which the insulating member 32 is not disposed. Accordingly, the distance Db between the centers of the columnar members 30 in the portion 24b is 4 times the arrangement period Da; and the distance Dc between the centers of the columnar members 30 in the portion 24c is 3 times the arrangement period Da. In other words, Db=4 Da; and Dc=3 Da.

Actually, there is a possibility that the distances Db and Dc may fluctuate due to the error of the processes, etc.; but the distance Db is greater than 3.5 times but less than 4.5 times the arrangement period Da; and the distance Dc is greater than 2.5 times but less than 3.5 times the arrangement period Da. In other words, 3.5 Da<Db<4.5 Da; and 2.5 Da<Dc<3.5 Da.

Thus, in the embodiment, sufficient space to form the through-hole 93 (the insulating member 32) is ensured in the portion 24b; and the distance between the columnar members 30 in the portion 24c is reduced. As a result, in the semiconductor memory device 2, the integration of the memory cell transistors can be increased. Otherwise, the configuration, the manufacturing method, and the effects of the embodiment are similar to those of the first embodiment described above.

Third Embodiment

A third embodiment will now be described.

Figure 10:
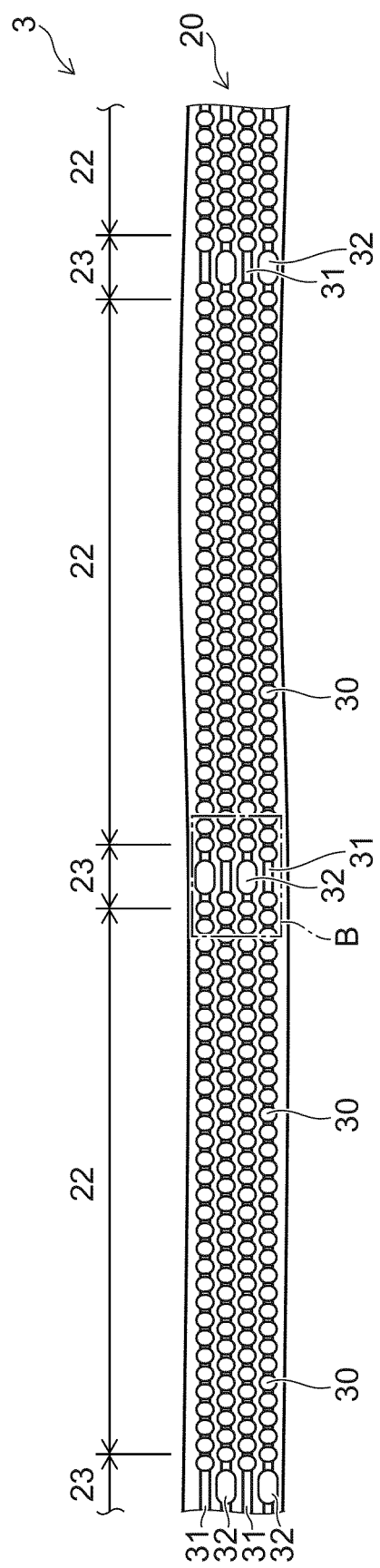
FIG. 10 is a plan view showing a semiconductor memory device according to a third embodiment.

FIG. 10 is a plan view showing a semiconductor memory device according to the embodiment.

Figure 11:
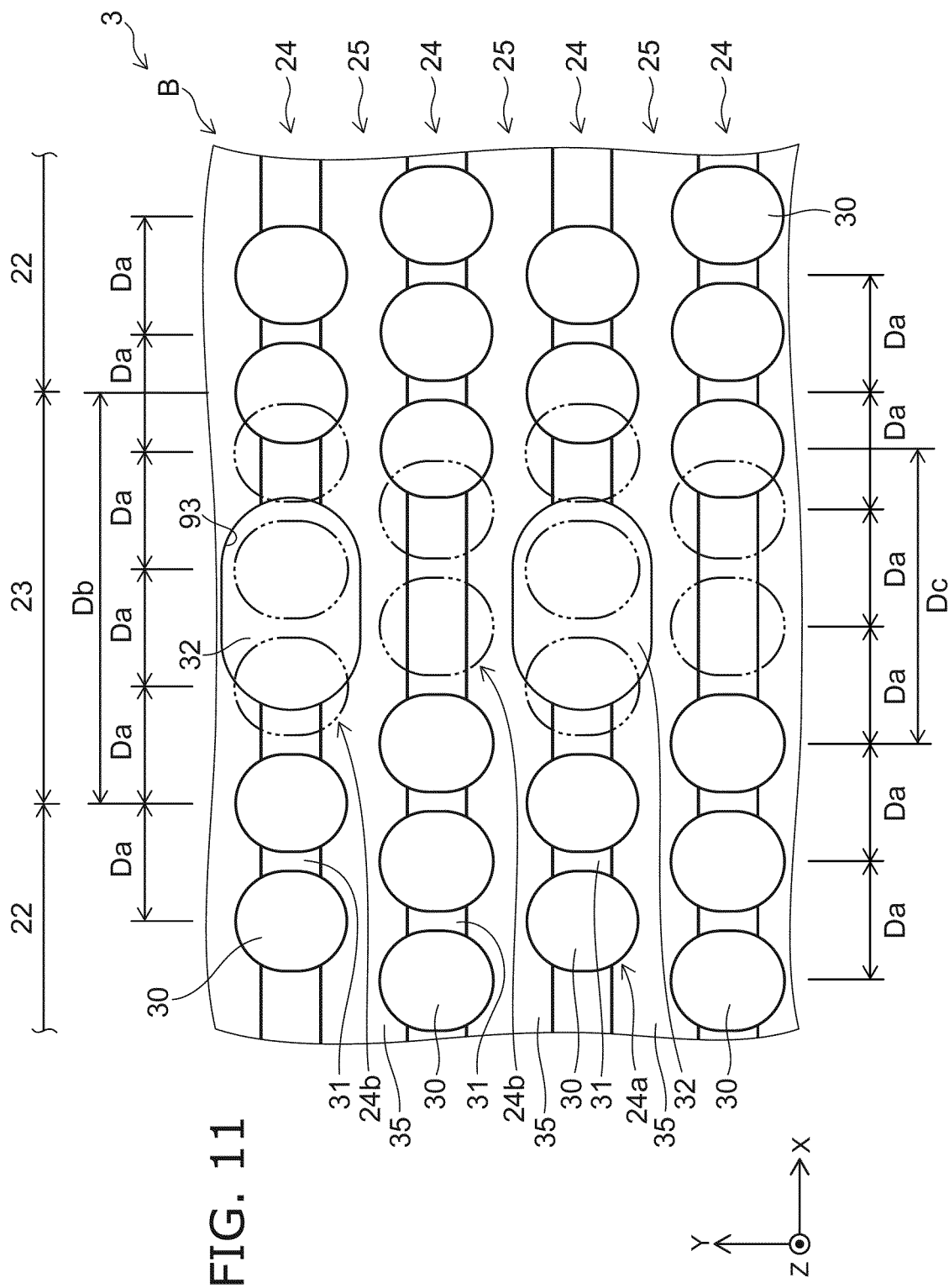
FIG. 11 is a plan view showing region B of FIG. 10.

FIG. 11 is a plan view showing region B of FIG. 10.

The embodiment is an example in which the first embodiment and the second embodiment described above are combined.

In the semiconductor memory device 3 according to the embodiment as shown in FIG. 10 and FIG. 11, the arrangements of the columnar members 30 have a mirror-image relationship with respect to the imaginary YZ plane and are shifted half a period between the mutually-adjacent memory cell regions 22. Thereby, the distance Db between the centers of the columnar members 30 in the portion 24b can be set to 3.5 times the arrangement period Da; and the distance Dc between the centers of the columnar members 30 in the portion 24c can be set to 2.5 times the arrangement period Da. In other words, Db=3.5 Da; and Dc=2.5 Da.

Actually, there is a possibility that the distances Db and Dc may fluctuate due to the error of the processes, etc.; but the distance Db is greater than 3 times but less than 4 times the arrangement period Da; and the distance Dc is greater than 2 times but less than 3 times the arrangement period Da. In other words, 3 Da<Db<4 Da; and 2 Da<Dc<3 Da.

According to the embodiment, the integration of the memory cell transistors can be improved even more compared to the first and second embodiments. Otherwise, the configuration, the manufacturing method, and the effects of the embodiment are similar to those of the first embodiment described above.

Fourth Embodiment

A fourth embodiment will now be described.

Figure 12:
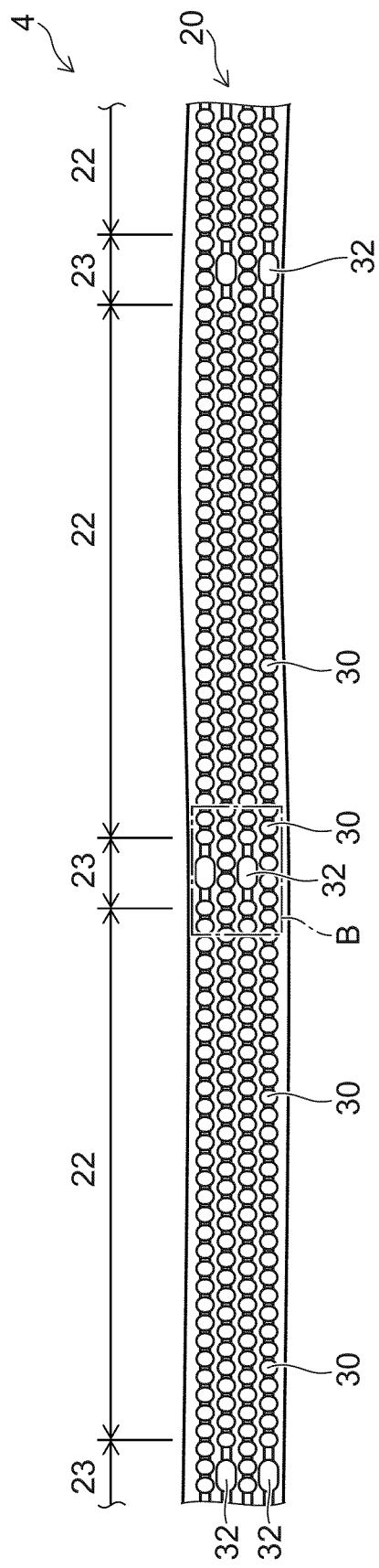
FIG. 12 is a plan view showing a semiconductor memory device according to a fourth embodiment.

FIG. 12 is a plan view showing a semiconductor memory device according to the embodiment.

Figure 13:
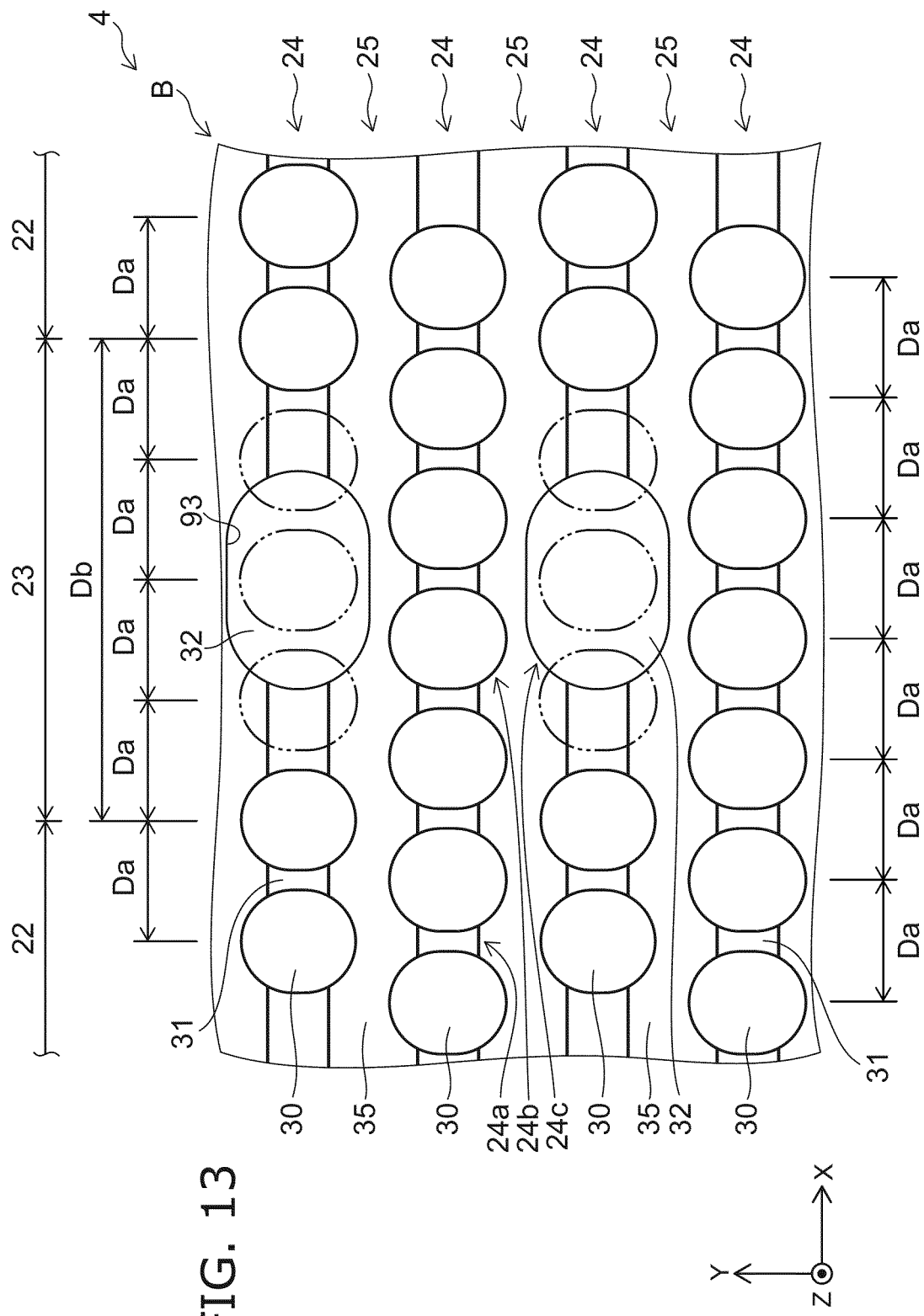
FIG. 13 is a plan view showing region B of FIG. 12.

FIG. 13 is a plan view showing region B of FIG. 12.

As shown in FIG. 12 and FIG. 13, the semiconductor memory device 4 according to the embodiment differs from the semiconductor memory device 2 according to the second embodiment described above (referring to FIG. 8 and FIG. 9) in that the columnar members 30 in the portion 24c of the memory cell structure body 24 are arranged at the arrangement period Da. The columnar members 30 are arranged at the arrangement period Da in the portion 24a as well; therefore, the columnar members 30 are arranged periodically at the arrangement period Da along the X-direction over the total length between the insulating members 32 adjacent to each other in the X-direction. Accordingly, the distance Dc between the centers of the columnar members 30 in the portion 24c is equal to the arrangement period Da. The distance Db between the centers of the columnar members 30 in the portion 24b is 4 times the arrangement period Da. In other words, Db=4 Da; and Dc=Da.

Actually, there is a possibility that the distances Db and Dc may fluctuate due to the error of the processes, etc.; but the distance Db is greater than 3.5 times but less than 4.5 times the arrangement period Da; and the distance Dc is greater than 0.5 times but less than 1.5 times the arrangement period Da. In other words, 3.5 Da<Db<4.5 Da; and 0.5 Da<Dc<1.5 Da.

Thus, according to the embodiment, the integration of the memory cell transistors can be improved even more compared to the second embodiment. Otherwise, the configuration, the manufacturing method, and the effects of the embodiment are similar to those of the first embodiment described above.

According to the embodiments described above, a semiconductor memory device that has high integration of the memory cell transistors can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of first structure bodies; and
a plurality of second structure bodies,
the plurality of first structure bodies and the plurality of second structure bodies being arranged alternately along a first direction,
the first structure bodies including a plurality of electrode films arranged to be separated from each other along a second direction crossing the first direction,
the second structure bodies including
a plurality of columnar members, the columnar member including a semiconductor member and a charge storage member, the semiconductor member extending in the second direction, the charge storage member being provided between the semiconductor member and the electrode film,
a plurality of first insulating members, and
a plurality of second insulating members arranged along a third direction crossing the first direction and the second direction, lengths in the first direction of the plurality of second insulating members being longer than lengths in the first direction of the plurality of first insulating members,
positions of the second insulating members in the third direction being different from each other between the second structure bodies adjacent to each other in the first direction,
the columnar members and the first insulating members being arranged alternately between the second insulating members.

2. The device according to claim 1, wherein the columnar members are arranged periodically along the third direction between the second insulating members.

3. The device according to claim 1, wherein
the columnar members are arranged at a first period in a first portion of the second structure bodies,
a distance between centers of the columnar members in the third direction is longer than the first period in a second portion and a third portion of the second structure bodies,
the second insulating member is disposed in the second portion,
the third portion is positioned between the second portions in the first direction, and
the first portion is positioned between the second portion and the third portion in the third direction.

4. The device according to claim 3, wherein
the distance between the centers of the columnar members is greater than 3 times but less than 4 times the first period in the second portion, and
the distance between the centers of the columnar members is greater than 3 times but less than 4 times the first period in the third portion.

5. The device according to claim 4, wherein
the distance between the centers of the columnar members is 3.5 times the first period in the second portion, and
the distance between the centers of the columnar members is 3.5 times the first period in the third portion.

6. The device according to claim 3, wherein
the distance between the centers of the columnar members is greater than 3.5 times but less than 4.5 times the first period in the second portion, and
the distance between the centers of the columnar members is greater than 2.5 times but less than 3.5 times the first period in the third portion.

7. The device according to claim 6, wherein
the distance between the centers of the columnar members is 4 times the first period in the second portion, and
the distance between the centers of the columnar members is 3 times the first period in the third portion.

8. The device according to claim 3, wherein
the distance between the centers of the columnar members is greater than 3 times but less than 4 times the first period in the second portion, and
the distance between the centers of the columnar members is greater than 2 times but less than 3 times the first period in the third portion.

9. The device according to claim 8, wherein
the distance between the centers of the columnar members is 3.5 times the first period in the second portion, and
the distance between the centers of the columnar members is 2.5 times the first period in the third portion.

10. The device according to claim 1, further comprising a second insulating layer provided between the columnar member and the electrode film,
the columnar member further including a first insulating layer provided between the charge storage member and the second insulating layer, a dielectric constant of the second insulating layer being higher than a dielectric constant of the first insulating layer, the second insulating layer being disposed on a side surface of the first insulating layer and on a side surface of the first insulating member, and not being disposed on a side surface of the second insulating member.

11. The device according to claim 1, wherein the columnar member further includes a tunneling insulating film provided between the semiconductor member and the charge storage member.

12. The device according to claim 1, further comprising a conductive body, the plurality of first structure bodies and the plurality of second structure bodies being arranged in the second direction when viewed from the conductive body, the semiconductor members being connected to the conductive body.

13. A semiconductor memory device, comprising:

a conductive body;

a stacked body provided on the conductive body, the stacked body including a plurality of electrode films arranged to be separated from each other along a first direction away from the conductive body;

semiconductor members extending in the first direction, being provided inside the stacked body, and being connected to the conductive body; and a charge storage member provided between the electrode film and one of the semiconductor members, the semiconductor members being arranged periodically along a second direction in a first region and in a second region, the first region and the second region being separated from each other in the second direction, the second direction crossing the first direction, the arrangement of the semiconductor members in the second region being shifted half a period with respect to the arrangement of the semiconductor members in the first region.

14. The device according to claim 13, wherein the arrangement of the semiconductor members in the second region has a mirror-image relationship with respect to the arrangement of the semiconductor members in the first region.

* * * * *